US007795903B2

(12) United States Patent
Pan et al.

(10) Patent No.: US 7,795,903 B2
(45) Date of Patent: *Sep. 14, 2010

(54) OUTPUT BUFFER AND METHOD HAVING A SUPPLY VOLTAGE INSENSITIVE SLEW RATE

(75) Inventors: Dong Pan, Boise, ID (US); Paul Silvestri, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/428,332

(22) Filed: Apr. 22, 2009

(65) Prior Publication Data

US 2009/0201046 A1 Aug. 13, 2009

Related U.S. Application Data

(63) Continuation of application No. 11/881,472, filed on Jul. 26, 2007, now Pat. No. 7,528,624, which is a continuation of application No. 11/087,293, filed on Mar. 22, 2005, now Pat. No. 7,262,637.

(51) Int. Cl.
*H03K 19/003* (2006.01)

(52) U.S. Cl. .......................................... 326/29; 326/34

(58) Field of Classification Search .................. 326/29, 326/31–34, 82–83, 86–87; 327/108, 170
See application file for complete search history.

(56) References Cited

U.S. PATENT DOCUMENTS 5,017,807 A 5/1991 Kriz et al. .................. 307/443
5,311,077 A 5/1994 Brown ........................ 307/443
5,311,084 A 5/1994 Gabara ....................... 307/491
5,489,862 A 2/1996 Risinger et al. ............ 327/108
5,537,070 A 7/1996 Risinger .................... 327/170
5,568,081 A 10/1996 Lui et al. .................. 327/380
5,623,216 A 4/1997 Penza et al. .................. 326/27
5,656,960 A 8/1997 Holzer ...................... 327/170
5,663,664 A 9/1997 Schnizlein .................. 326/83
5,862,390 A 1/1999 Ranjan ................. 395/750.01
5,877,647 A 3/1999 Vajapey et al. ............. 327/391
6,040,707 A 3/2000 Young et al. ................. 326/21
6,069,504 A 5/2000 Keeth ........................ 327/108
6,072,729 A 6/2000 Casper ................. 365/189.05
6,172,938 B1 1/2001 Suzuki et al. .............. 365/233
6,236,248 B1 5/2001 Koga .......................... 327/112
6,243,797 B1 6/2001 Merritt ...................... 711/167
6,281,729 B1 8/2001 Ang et al. .................. 327/170

(Continued)

*Primary Examiner*—James Cho
(74) *Attorney, Agent, or Firm*—Dorsey & Whitney LLP

(57) ABSTRACT

An output buffer includes a final driver formed by first and second MOSFET transistors that alternately couple an output terminal to respective supply voltages. The output terminal is biased to a bias voltage intermediate the supply voltages. The slew rate at which the MOSFET transistors transition the output terminal to the supply voltages is affected by the magnitude of at least one of the supply voltages. The output buffer is driven by a pre-driver coupling first and second control signals to the first and second MOSFET transistors, respectively. The pre-driver adjusts the delay between generating one of the control signals to turn off the MOSFET transistor and generating the other of the control signals to turn on the other MOSFET transistor as a function of the supply voltage magnitude to make the slew rate of the resulting transition substantially insensitive to variations in power supply voltage.

11 Claims, 7 Drawing Sheets

U.S. PATENT DOCUMENTS 6,288,563 B1 9/2001 Muijono ...................... 326/27
6,297,677 B1 10/2001 Ang et al. ................... 327/170
6,333,654 B1 * 12/2001 Harris et al. ................ 327/170
6,404,258 B2 6/2002 Ooishi ........................ 327/278
6,489,807 B2 12/2002 Genna et al. .................. 326/56
6,518,808 B2 2/2003 Shimoda ..................... 327/172
6,535,020 B1 3/2003 Yin ............................ 326/83
6,552,613 B2 4/2003 Murray et al. .............. 330/255
6,571,376 B1 5/2003 Levin et al. .................... 716/5
6,664,821 B2 12/2003 De Haas et al. ............. 327/108
6,710,617 B2 3/2004 Humphrey ................... 326/30
6,714,461 B2 3/2004 Matsumoto et al. .... 365/189.05
6,829,177 B2 12/2004 Bedarida et al. ....... 365/189.05
6,834,255 B2 12/2004 Abrosimov et al. ......... 702/181
RE38,685 E 1/2005 Casper ....................... 365/158
6,847,582 B2 1/2005 Pan ............................ 365/233
6,894,547 B2 5/2005 Takahashi ................... 327/170
6,903,588 B2 6/2005 Vorenkamp ................. 327/170
6,924,669 B2 8/2005 Itoh et al. ..................... 326/87
7,015,721 B2 3/2006 Nguyen et al. ................ 326/83
7,019,551 B1 * 3/2006 Biesterfeldt .................. 326/29

* cited by examiner

OUTPUT BUFFER AND METHOD HAVING A SUPPLY VOLTAGE INSENSITIVE SLEW RATE

CROSS-REFERENCE TO RELATED APPLICATIONS

This application is a continuation of U.S. patent application Ser. No. 11/881,472, filed Jul. 26, 2007, which is a continuation of U.S. patent application Ser. No. 11/087,293, filed Mar. 22, 2005, U.S. Pat. No. 7,262,637. These applications are incorporated by reference herein.

TECHNICAL FIELD

This invention relates generally to integrated circuits and, more particularly, to an integrated circuit output buffer circuit generating an output signal having a slew-rate that is substantially insensitive to variations in the voltage of power supplied to the integrated circuit.

BACKGROUND OF THE INVENTION

Today's electronic components are designed so that they will function properly when used with components from a variety of manufacturers. For example, memory devices, such as dynamic random access memory ("DRAM") devices, are designed to function properly with memory controllers and other components available from a variety of sources.

To ensure performance and allow component compatibility, the operating characteristics and parameters of electronic devices are specified in substantial detail. Other electronic devices are then designed to properly interface with the electronic device based on the specification. For example, specifications for Synchronous Dynamic Random Access Memory (SDRAM) devices generally specify a range of supply voltages that can be used to power the SDRAM devices. The specification also identifies the acceptable ranges of the rise- and fall-time slew rates (Volts/nanosecond) of read data signals output from the SDRAM devices. To meet the specification, an SDRAM device must be capable of meeting each parameter at any value of each of the other specified parameters. Therefore, SDRAM devices must be capable of outputting read data signals having the specified rise- and fall-time slew rates throughout the range of specified supply voltages. It can also be important that the slew rates of the read data signals not vary as operating parameters, such as the supply voltage, are varied. Unfortunately, both the rise-time and fall-time slew rates of read data signals output from conventional SDRAM devices often vary significantly with supply voltage variations. These variation can make it difficult to meet the slew rate specifications at all supply voltages within the specified range.

As the operating speed of SDRAM devices and associated devices continues to increase, the variations in slew rate as a function of supply voltage variations can become a more significant problem. Problems resulting from slew rate variations have also become more significant in double-data rate (DDR) SDRAM devices, which output read data on both the rising edge and the falling edge of a read data strobe that is synchronized to a master clock signal.

FIG. 1 shows a conventional output buffer 10 commonly in use in DDR SDRAMs. The output buffer 10 includes a first pre-driver 14 containing a first inverter 16 that receives an active high D_PUP signal, and a second inverter 18 that receives an active low D_PDN_signal. As explained below, the D_PUP signal is activated high to output a high read data output signal, and the D_PDN_signal is activated low to output a low read data output signal.

The inverter 16 generates an active low PUPEN_signal from the D_PDN signal, and the inverter 18 generates an active low PDNEN_signal from the D_PDN_signal. These signals are applied to a second pre-driver 20. The PUPEN_signal is applied to one input of a NOR gate 22 having an output that drives an inverter 24, which, in turn, outputs an active low PUP_signal. A second input of the NOR gate 22 receives a DQEN_signal, which is active low when read data are to be output from the output buffer 10. Thus, the PUP_signal is active low to cause the output buffer 10 to output a high read data signal whenever the NOR gate 22 is enabled by a low DQEN_signal and the D_PUP signal is active high. Similarly, the PUPEN signal is applied to one input of a NAND gate 26 having an output that drives an inverter 28, which, in turn, outputs an active high PDN signal. A second input of the NAND gate 26 receives a DQEN signal, which the compliment of the DQEN_signal. The DQEN signal is active high when read data are to be output from the output buffer 10. Thus, the PDN signal is active high to cause the output buffer 10 to output a low read data signal whenever the NAND gate 26 is enabled by a high DQEN signal and the D_PDN signal is active high.

The output buffer 10 includes a final driver 30 having a PMOS transistor 32 coupled between a positive supply voltage VCCQ and a data output terminal DQ_OUT through a resistor 34. The output buffer 10 also includes an NMOS transistor 36 coupled between a negative supply voltage VSSQ, which will assumed to be ground, and the data output terminal DQ_OUT through a resistor 38. The data output terminal DQ_OUT is biased to a suitable voltage, which is typically VCCQ/2, through a resistor 40.

The DQ_OUT terminal is normally at VCCQ/2 when the PUP_signal is inactive high and the PDN signal is inactive low. When the PUP_signal is active low and the PDN signal is inactive low, the PMOS transistor 32 turns ON to couple the DQ_OUT terminal to VCCQ. When the PDN signal is active high and the PUP_signal is inactive high, the NMOS transistor 36 turns ON to couple the DQ_OUT terminal to ground. As long as the slew rate at which the signal at the DQ_OUT terminal transitions to VCCQ and to ground, the buffer 10 shown in FIG. 1 provides adequate performance. However, if maintaining the slew rate constant despite variations in the magnitude of the supply voltage VCCQ is important, the buffer 10 may not provide adequate performance.

The manner in which the slew rate of read data signals from the output buffer 10 varies will now be explained with reference to FIGS. 2A and 2B, which shows the timing of the signals in the output buffer 10 at two different levels of supply voltage. The time delay through the gates are ignored in FIG. 2A and FIG. 2B for simplicity. As illustrated in FIG. 2A, the voltage at the DQ_OUT terminal begins transitioning from low-to-high responsive to the D_PDN_signal transitioning low-to-high at time $t_0$ and the D_PUP signal transition from low-to-high after a short delay $t_{dr}$ at time $t_1$. As further shown in FIG. 2A, the low-to-high transition of the D_PDN_signal causes the PDNEN signal at the output of the inverter 18 (FIG. 1) to transition low, and the low-to-high transition of the D_PUP signal causes the PUPEN_signal at the output of the inverter 16 to also transition low. As a result, the PDNEN signal transitions low before the PUPEN_transitions low with the same delay $t_{dr}$. The PDNEN signal is coupled through the NAND gate 26 and the inverter 28 to generate a PDN signal, which transitions from high-to-low at time $t_0$. Similarly, The PUPEN_signal is coupled through the NOR gate 22 and the inverter 24 to generate a PUP_signal, which transitions from high-to-low at time $t_1$. The low PDN signal turns OFF the NMOS transistor 36, and the low PUP_signal turns ON the PMOS transistor 32. The delay $t_{dr}$ between the time to at which the NMOS transistor 36 is turned OFF and the time $t_1$ at which the PMOS transistor 32 is turned ON ensures that the NMOS transistor 36 has turned OFF before the PMOS transistor 32 is turned ON.

When the NMOS transistor 36 turns OFF at time $t_0$, the voltage at the DQ_OUT terminal begins increasing even through the PMOS transistor 32 has not yet been turned ON because of the VCCQ/2 bias applied to the DQ_OUT terminal. When the PMOS transistor 32 turns ON at time $t_1$, the transition of the DQ_OUT terminal to a high logic level corresponding to VCCQ continues, and the DQ_OUT terminal reaches the VCCQ voltage at time $t_2$. In reality, DG_OUT may reach VCCQ voltage before of after $t_2$. The rising edge slew rate of the signal at the DQ_OUT terminal is the ratio of the voltage change, i.e., VCCQ, to the transition time, i.e., $t_2$ less $t_0$.

In a similar manner, the voltage at the DQ_OUT terminal begins transitioning from high-to-low at time $t_3$ when the PUP_signal transitions low-to-high responsive to the D_PUP signal transitioning low, thereby turning OFF the PMOS transistor 32.

In a similar manner, the voltage at the DQ_OUT terminal begins transitioning from high-to-low responsive to the D_PUP signal transitioning from high-to-low at time $t_3$ and the D_PDN_signal transitioning high-to-low after a short delay $t_{df}$ at time $t_4$. The high-to-low transition of the D_PDN_signal causes the PDNEN signal at the output of the inverter 18 (FIG. 1) to transition high, and the high-to-low transition of the D_PUP signal causes the PUPEN_signal at the output of the inverter 16 to also transition high. The PUPEN_signal causes the PUP_signal to transitions from low-to-high at time $t_3$, and the PDNEN signal causes the PDN signal to transition from low-to-high at time $t_4$. The high PUP_signal turns OFF the PMOS transistor 32, and the high PDN signal turns ON the NMOS transistor 36. Again, the delay $t_{df}$ between the time $t_3$ at which the PMOS transistor 32 is turned OFF and the time 4 at which the NMOS transistor 36 is turned ON ensures that the PMOS transistor 32 has turned OFF before the NMOS transistor 36 is turned ON. When the PMOS transistor 32 turns OFF at time $t_3$, the voltage at the DQ_OUT terminal begins decreasing even through the NMOS transistor 38 has not yet been turned ON because of the VCCQ/2 bias voltage. When the NMOS transistor 38 turns ON at time $t_4$, the transition of the DQ_OUT terminal to a low logic level corresponding to ground continues, and the DQ_OUT terminal reaches zero volts at time $t_5$. The falling edge slew rate of the signal at the DQ_OUT terminal is again the ratio of the voltage change, i.e., VCCQ, to the transition time, i.e., $t_5$ less $t_3$.

The switching characteristics of the output buffer 10 when the magnitude of the power supply voltage VCCQ increases to VCCQ' is shown in FIG. 2B. The switching times $t_0$-$t_5$ of all signals are labeled in the same manner as in FIG. 2A. The falling edge transition time $t_2$ less $t_0$ and the rising edge transition time $t_5$ less $t_3$ for a supply voltage of VCCQ' are shown in FIG. 2B as being the same as the falling edge transition time $t_2$ less $t_o$ and the rising edge transition time $t_5$ less $t_3$ for a supply voltage of VCCQ as shown in FIG. 2A although in practice they may be longer or shorter. In any case, since the transitions between ground the supply voltage is greater when VCCQ' is larger as shown in FIG. 2B, the slew rates of the signal at the DQ_OUT terminal are also greater. The signal at the output terminal is able to transition between ground the VCCQ' at this high rate with the greater supply voltage VCCQ' primarily because the PMOS transistor 32 is turned ON with a greater gate-to-source voltage. The voltage at the DQ_OUT terminal is able to transition low from VCCQ' to ground at this high rate with the greater supply voltage VCCQ' primarily because the NMOS transistor 36 is turned ON with a greater gate-to-source voltage because the inverter 28 is normally also powered by the greater supply voltage VCCQ'.

This variation in the slew rate at the DQ_OUT terminal can create problems at high speeds where timing is critical, and it can make it more difficult for memory devices and other integrated circuits containing the output buffer 10 from meeting slew-rate specifications. There is therefore a need for an output buffer that is capable of providing an output signal having rising edge and falling edge slew rates that are substantially insensitive to variations in the magnitude of a voltage supplying power to the output buffer.

SUMMARY OF THE INVENTION

An output buffer and method generates an output signal at an output terminal in a manner that makes the slew rate of the output signal substantially insensitive to variations in a power supply voltage coupled to the output buffer. The output buffer includes a first switch that closes to couple the output terminal to a first level, and a second switch that closes to couple the output terminal to a second level that is different from the first level. The output terminal being biased to a third level that is intermediate the first and second levels so that the output terminal is at the third level when both of the first and second switches are open. Unfortunately, the rate at which the output signal generated at the output terminal transitions to at least one of the first and second levels varies with the magnitude of the power supply voltage. To compensate for this variation in slew rate, at least one of the switches is closed a delay period after opening the other of the switches. The duration of the delay period is adjusted as a function of the supply voltage so that the slew rate of the output signal is substantially insensitive to variations in the magnitude of the supply voltage.

DETAILED DESCRIPTION

Figure 1:
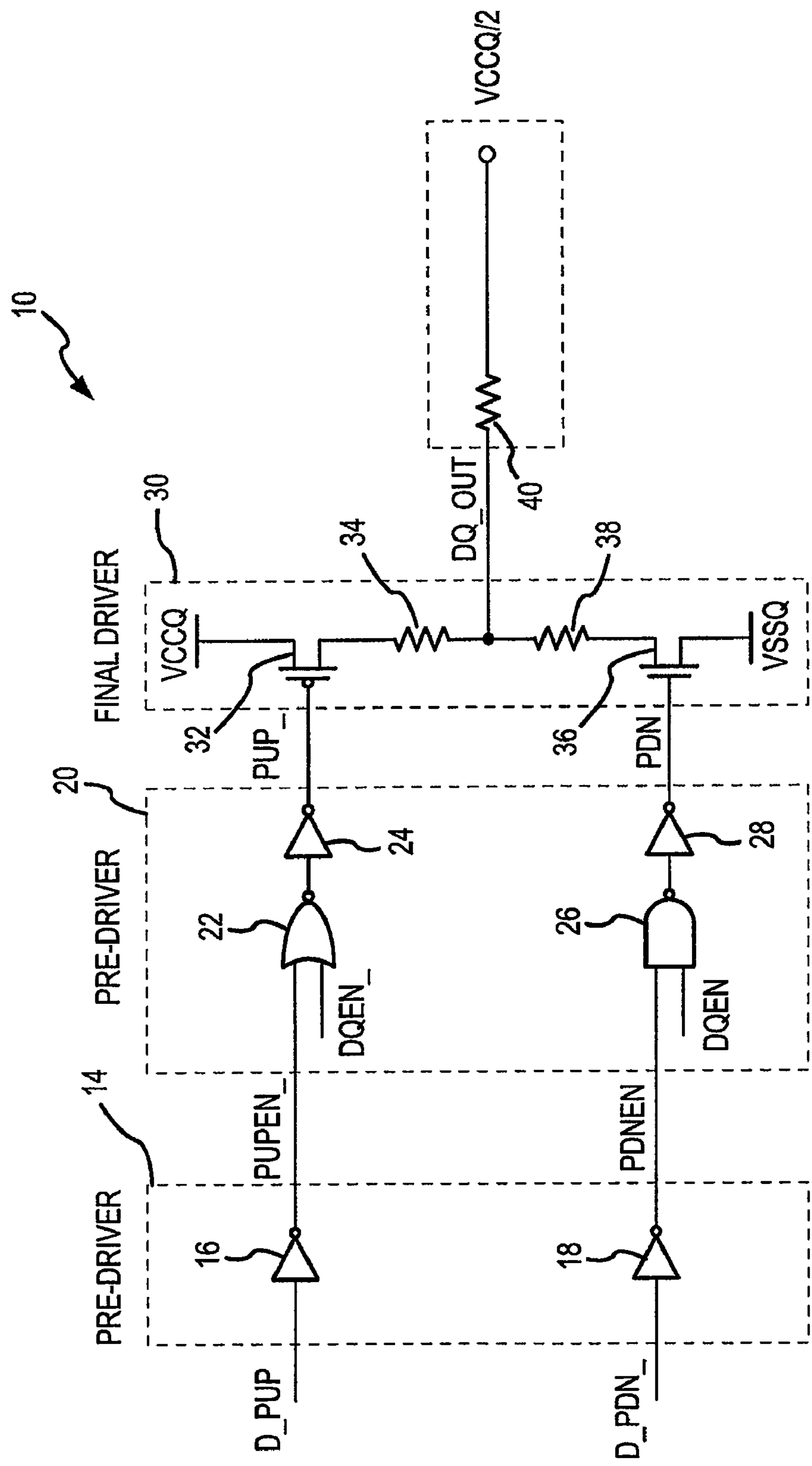
FIG. 1 is a logic diagram and schematic diagram of a conventional output buffer.
Figure 3:
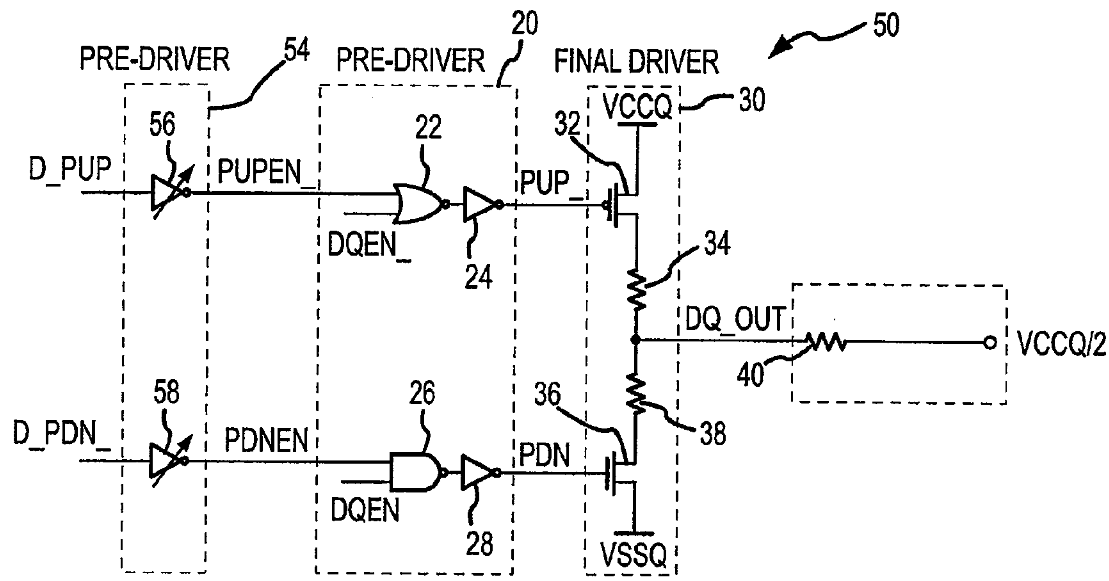
FIG. 3 is a logic diagram and schematic diagram of an output buffer according to one embodiment of the invention.

An output buffer 50 according to one embodiment of the invention is shown in FIG. 3. The output buffer 50 uses most of the same components operating in the same manner as the output buffer 10 shown in FIG. 1. Therefore, in the interest of brevity, these common components have been provided with the same reference numerals, and a description of their structure and operation will not be repeated.

The output buffer 50 differs from the conventional output buffer 10 by using a first pre-driver 54 containing a first inverter 56 receiving the D_PUP signal that has voltage controlled switching characteristics, and a second inverter 58 receiving the D_PDN_signal that also has voltage controlled switching characteristics. In contrast, the corresponding inverters 16, 18 in the output buffer 10 of FIG. 1 have fixed switching characteristics. The switching characteristics of the inverters 56, 58 are controlled by the magnitude of the supply voltage VCCQ in a manner that will be described with reference to FIGS. 4A and 4B to make the rising and falling edge slew rates of the signal at the DQ_OUT terminal substantially insensitive to variations in the magnitude of the supply voltage VCCQ.

Figure 2A:
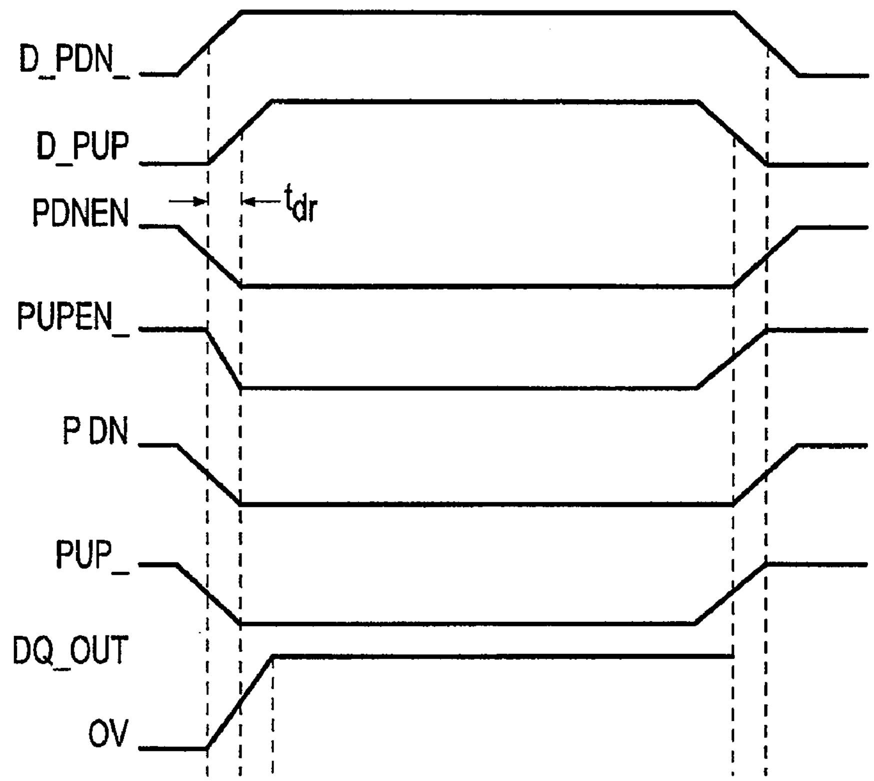
FIGS. 2A and 2B are timing diagrams showing the switching characteristics of the output buffer of FIG. 1 with two different magnitudes of a voltage supplying power to the output buffer.
Figure 2B:
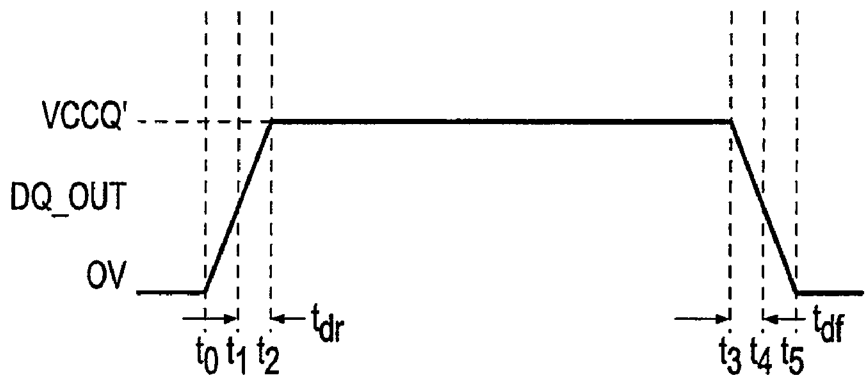
Figure 4A:
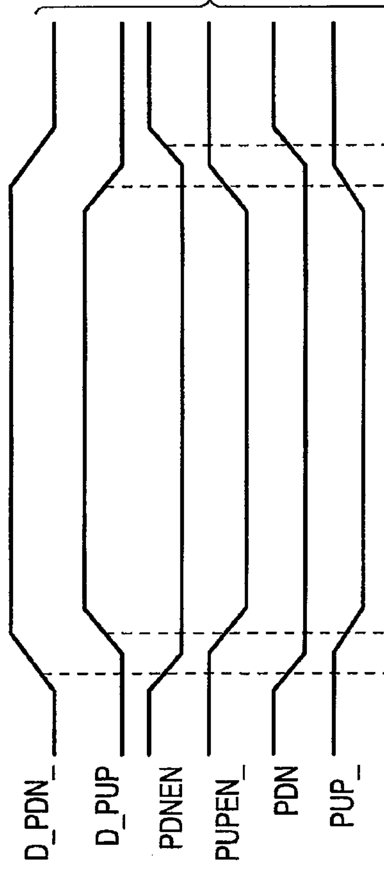
FIGS. 4A and 4B are timing diagrams showing the switching characteristics of the output buffer of FIG. 1 with two different magnitudes of a voltage supplying power to the output buffer.
Figure 4B:
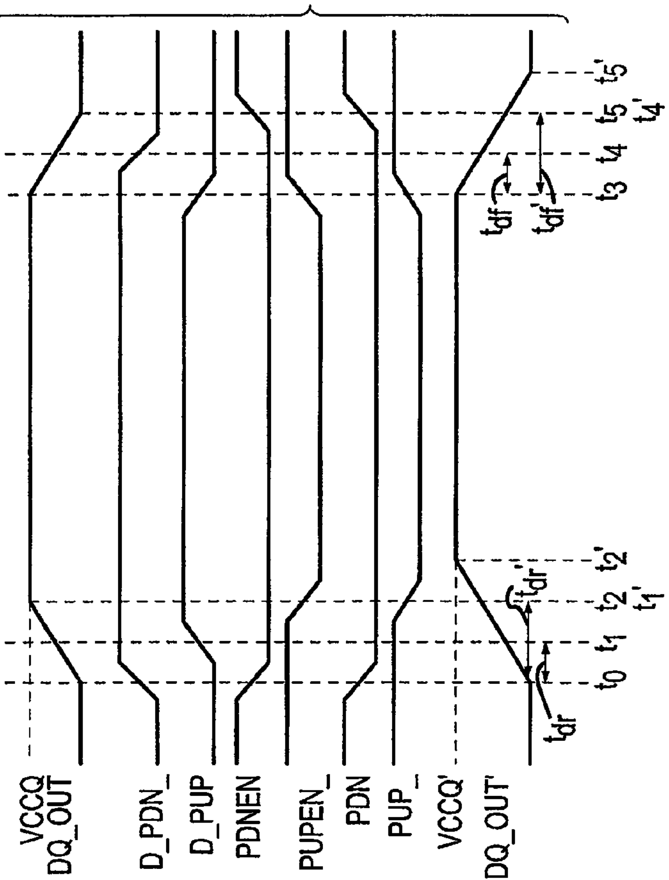

The switching characteristics of the output buffer 50 for two different magnitudes of the supply voltage VCCQ and VCCQ' respectively are shown in FIGS. 4A and 4B. The signals for the magnitude of the supply voltage VCCQ shown in FIG. 4A are identical to the signals shown in FIG. 2A. Therefore, in the interest of brevity, an explanation of these signals will not be repeated. However, it will be noted that the falling edge of the PUP_signal is delayed from the falling edge of the PDN signal by the delay time $t_{dr}$, and the rising edge of the PDN signal is delayed from the rising edge of the PUP_signal by the same time delay $t_{df}$. Again, similar to the description for FIG. 2A, the time delays through the gates are ignored for simplicity in FIG. 4A. As previously explained, these delays are the result of the rising edge of the D_PUP signal being delayed from the rising edge of the D_PDN_signal by the delay $t_{dr}$, and the falling edge of the D_PDN_signal being delayed from the falling edge of the D_PUP signal by the delay $t_{df}$.

The signals shown in FIG. 4A are shown in FIG. 4B when the supply voltage VCCQ is increased to VCCQ'. As can be seen from FIG. 4B, the falling edge of the D_PUP signal is still delayed from the falling edge of the D_PDN_signal by the delay $t_{dr}$, and the rising edge of the D_PDN_signal is still delayed from the rising edge of the D_PUP signal by the delay $t_{df}$. However, the inverters 56, 58 in the first pre-driver 54 respond to the increased supply voltage by selectively increasing the delays of the inverters 56, 58. More specifically, the delay of the falling edge of the PUPEN_signal after the falling edge of the PDNEN signal is increased to $t_{dr}'$, and the delay of the rising edge of the PDNEN signal after the rising edge of the PUPEN_signal is increased to $t_{df}'$. This may be accomplished by designing the inverter 56 so that it increases the delay in outputting falling edges when the supply voltage increases, and by designing the inverter 58 so that it increases the delay in outputting rising edges when the supply voltage increases. However, other techniques can be used. For example, the inverters 56, 58 may be designed with a predetermined minimum delay. The inverter 56 can then be designed so that it decreases the delay in outputting rising edges when the supply voltage increases, and the inverter 58 can be designed so that it decreases the delay in outputting falling edges when the supply voltage increases.

The manner in which adjusting the delay of the inverters 56, 58 as a function of supply voltage VCCQ can maintain the slew rate constant can be seen from an examination of FIG. 4B. By increasing the delay of the falling edge of the PUPEN_signal so that it transitions at $t_1'$, the delay of the falling edge of the PUP_signal from the falling edge of the PDN signal is increased to $t_{dr}'$. As a result, the delay in turning on the PMOS transistor 32 after turning OFF of the NMOS transistor 36 is also increased to $t_{dr}'$. As can be seen in FIG. 4B, this increased delay has the effect of increasing the low-to-high switching time of the signal at the DQ_OUT terminal commensurate with the increase in supply voltage. Similarly, by increasing the delay of the rising edge of the PDNEN signal so that it transitions at $t_4'$, the delay of the rising edge of the PDN signal from the falling edge of the PUP_signal is increased to $t_{df}'$. As a result, the delay in turning ON of the NMOS transistor 36 after the turning OFF of the PMOS transistor 32 is also increased to $t_{df}'$. Again, this has the effect of increasing the high-to-low switching time of the signal at the DQ_OUT terminal commensurate with the increase in supply voltage. By increasing switching times of the signal at the DQ_OUT terminal commensurate with the increase in supply voltage, the rate at which the voltage changes, i.e., the slew rate, is maintained substantially constant.

Figure 5:
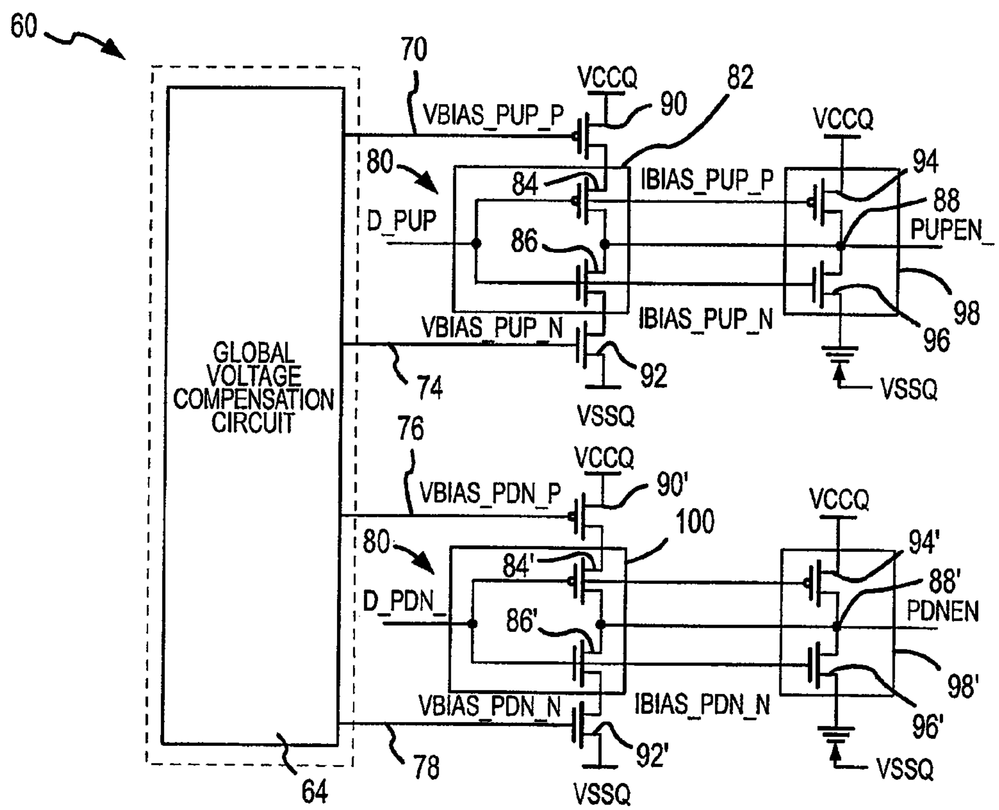
FIG. 5 is a schematic diagram of one embodiment of a pre-driver circuit usable in the output buffer of FIG. 3.

One embodiment of a pre-driver 60 that may be used as the pre-driver 54 containing the inverters 56, 58 is shown in FIG. 5. The pre-driver 60 includes a voltage compensation circuit 64, an example of which will be explained with reference to FIG. 5. The voltage compensation circuit 64 includes two output lines 70, 74 that provide respective signals VBIAS_PUP_P, VBIAS_PUP_N having magnitudes that decrease responsive to an increase in the magnitude of the supply voltage VCCQ. The voltage compensation circuit 64 also includes two output lines 76, 78 that provide respective signals VBIAS_PDN_P, VBIAS_PDN_N having magnitudes that increase responsive to an increase in the magnitude of the supply voltage VCCQ.

A first inverter 80 in the pre-driver 60 includes a first inverter section 82 formed by a PMOS transistor 84 and an NMOS transistor 86 coupled to each other and to an output port 88. The transistors 84, 86 have their gates coupled to receive the D_PUP signal, and they provide the PUPEN_signal at the output port 88. The transistors 84, 86 are coupled in series with a PMOS transistor 90 and an NMOS transistor 92. The VBIAS_PUP_P signal is applied to the gate of the PMOS transistor 90, and the VBIAS_PUP_N signal is applied to the gate of the NMOS transistor 92. As explained in greater detail below, these transistors 90, 92 control the load impedance of the transistors 84, 86, which has the effect of controlling the switching time of the first inverter section 82. The transistors 84, 86 in the first inverter section 82 are coupled to a PMOS transistor 94 and an NMOS transistor 96 in a second inverter section 98. The second inverter section 98 is essentially connected in parallel with the first inverter section 82 since the inverter section likewise has the gates of its transistors 94, 96 coupled to receive the D_PUP signal and their drains coupled to the output port 88. However, the sources of the transistors 94, 96 are coupled to the supply voltage VCCQ and VSSQ, respectively, instead of load transistors like transistors 90, 92.

The pre-driver 60 also includes a second inverter 100 that receives the D_PDN_signal, and it provides the PDNEN signal. The second inverter 100 is structurally and functionally identical to the first inverter 80 except that it receives the VBIAS_PDN_P and VBIAS_PDN_N, signals instead of the VBIAS_PUP_P and VBIAS_PUP_N, signals, respectively. Therefore, in the interest of brevity, these common components have been provided with the same reference numerals.

In operation, an increase in the magnitude of the supply voltage VCCQ causes a decrease in the magnitude of the VBIAS_PUP_P and VBIAS_PUP_N signals that are coupled to the PMOS transistor 90 and the NMOS transistor 92 in the inverter 80. The decrease in the VBIAS_PUP_P signal causes an increase in the current through the transistor 90 when the transistor 84 is turned ON, thereby decreasing the load impedance of the transistor 90. The decrease in the VBIAS_PUP_N signal causes a decrease in the current through the transistor 92 when the transistor 86 is turned ON, thereby increasing the load impedance of the transistor 92. These changes in the load impedances have the effect of decreasing the time required for the PUPEN_signal to transition high and increasing the time required for the PUPEN_signal to transition low. An increase in the magnitude of the supply voltage VCCQ also causes an increase in the magnitude of the VBIAS_PDN_P and VBIAS_PDN_N signals that are coupled to the PMOS transistor 90' and the NMOS transistor 92' in the inverter 100. The increase in the magnitude of the VBIAS_PDN_P signal causes the current through the transistor 90' to decrease, thereby increasing the load impedance of the transistor 90'. The increase in the magnitude of the VBIAS_PDN_N signal causes the current through the transistor 92' to increase, thereby decreasing the load impedance of the transistor 92'. Therefore, the time required for the PDNEN signal to transition high increases and the time required for the PDNEN signal to transition low decreases. The increased time required for the PUPEN_signal to transition low coupled with the decreased time required for the PDNEN signal to transition low has the effect of increasing the rising edge delay time $t_{dr}$ responsive to an increase in the supply voltage VCCQ. Similarly, the increased time required for the PDNEN signal to transition high coupled with the decreased time required for the PUPEN_signal to transition high increases the falling edge delay time $t_{df}$ responsive to an increase in the supply voltage VCCQ.

Figure 6:
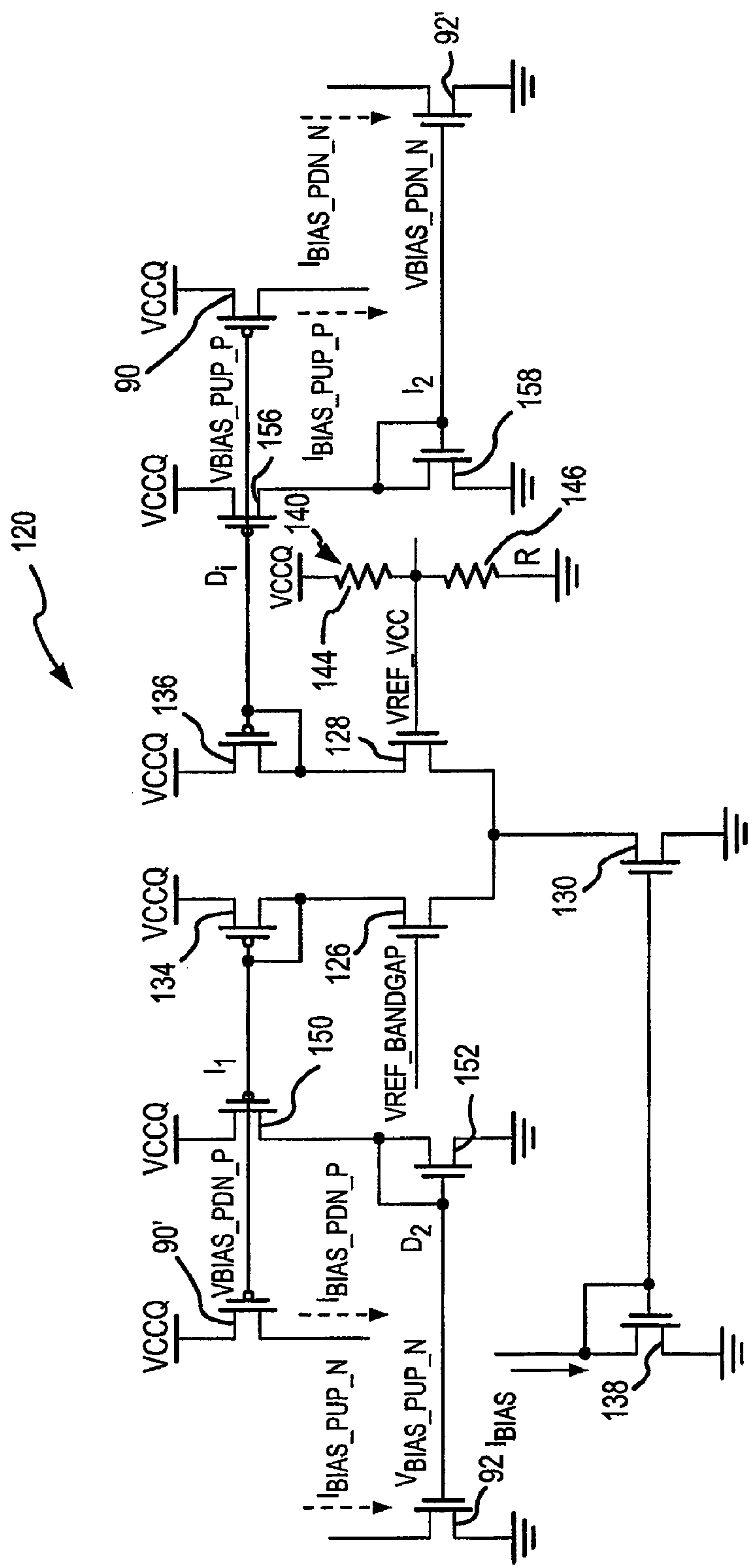
FIG. 6 is a schematic diagram of one embodiment of a voltage compensation circuit usable in the pre-driver of FIG. 5.

One embodiment of a voltage compensation circuit 120 that may be used as the voltage compensation circuit 64 in the pre-driver 60 of FIG. 5 is shown in FIG. 6. The voltage compensation circuit 120 includes a comparator 122 formed by a pair of differential NMOS transistors 126, 128 having their sources coupled to each other and to a current sinking NMOS transistor 130. A pair of diode-coupled PMOS load transistors 134, 136 are coupled between the supply voltage VCCQ and the drains of the transistors 126, 128, respectively. The gate of the current sinking transistor 130 is coupled to the drain of a diode coupled NMOS transistor 138 through which a reference current $I_{ref}$ flows. The transistor 138 provides a relatively constant bias voltage to the gate of the transistor 130 so that the sum of the currents flowing through the transistors 126, 128 is substantially constant.

The gate of the differential transistor 126 is coupled to receive a reference voltage $v_{ref}$ from a suitable source, such as a bandgap reference generator (not shown). The gate of the differential transistor 128 is coupled to a voltage divider 140 formed by a pair of resistors 144, 146. The voltage divider 140 is coupled to the supply voltage VCCQ so that the magnitude of the voltage applied to the gate of the transistors is proportional to the magnitude of the supply voltage VCCQ.

In operation, the voltage at the drain of the transistor 134 increases responsive to an increase in supply voltage VCCQ to provide the VBIAS_PDN_P signal, which is applied to the gate of the PMOS transistor 90' (FIG. 5). The bias current through the transistor 90' thus decreases, as previously explained with reference to FIG. 5. The voltage at the drain of the transistor 136 decreases responsive to an increase in supply voltage VCCQ to provide the VBIAS_PUP_P signal, which is applied to the gate of the PMOS transistor 90, thereby increasing the bias current through the transistor 90.

The VBIAS_PDN_P signal at the drain of the transistor 134 is also coupled to the gate of a PMOS transistor 150, which has its drain coupled to the drain of a diode-coupled NMOS transistor 152. As a result, the increasing VBIAS_PDN_P signal decreases the magnitude of the VBIAS_PUP_N signal as well as the current through the NMOS transistor 152. The PMOS transistor 92 (FIG. 5) is coupled to the transistor 152 in a current mirror configuration. Thus, in response to the reduced VBIAS_PUP_N signal, the bias current through the transistor 152 also decreases.

In a similar manner, the VBIAS_PUP_P signal is applied to the gate of a PMOS transistor 156, which has its drain coupled to the drain of a diode-coupled NMOS transistor 158. As a result, the decreasing VBIAS_PUP_P signal causes the transistor 156 to increase the magnitude of the VBIAS_PDN_N signal as well as the current through the NMOS transistor 158. The PMOS transistor 92' (FIG. 5) is coupled to the transistor 158 in a current mirror configuration. Thus, in response to the increases in the magnitude of the VBIAS_PDN_N signal, the bias current through the transistor 92' also increases. The increased bias currents reduce the impedances of the transistors 90, 92', and the decreased bias currents reduce the impedances of the transistors 90', 92 to alter the delay characteristics of the pre-driver 60 (FIG. 5) as previously explained.

Figure 7:
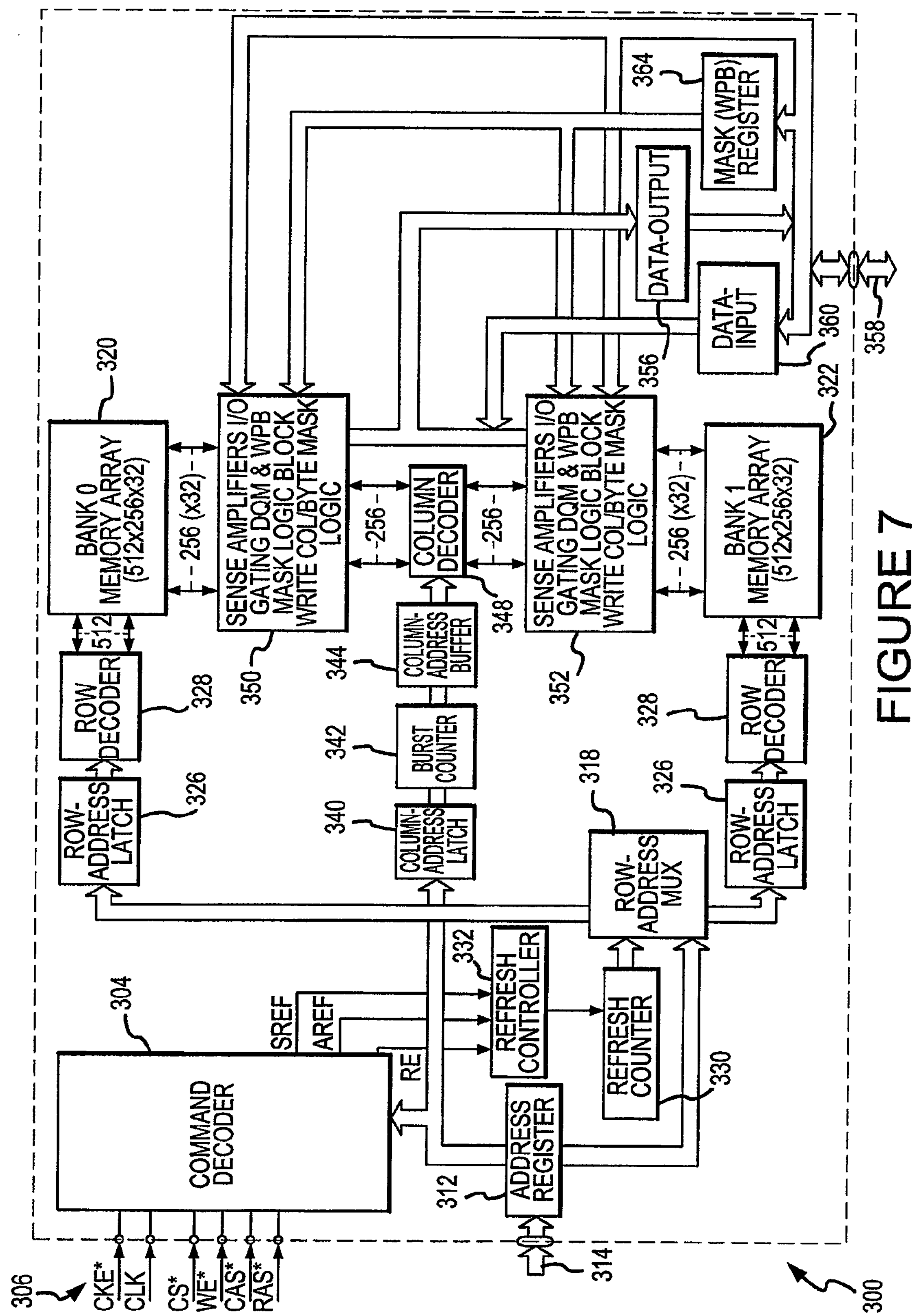
FIG. 7 is a block diagram of one embodiment of a memory device using an output buffer, such as the output buffer of FIG. 3, in accordance with the present invention.

FIG. 7 shows one embodiment of a memory device using that may use an output buffer in accordance with the present invention. The memory device is a conventional synchronous dynamic random access memory ("SDRAM") 300. However, it will be understood that output buffers according to the present invention can also be used in other types of memory devices or other circuits. The operation of the SDRAM 300 is controlled by a command decoder 304 responsive to high level command signals received on a control bus 306. These high level command signals, which are typically generated by a memory controller (not shown in FIG. 7), are a clock enable signal CKE*, a clock signal CLK, a chip select signal CS*, a write enable signal WE*, a row address strobe signal RAS*, and a column address strobe signal CAS*, in which the "*" designates the signal as active low. The command decoder 304 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

The SDRAM 300 includes an address register 312 that receives either a row address or a column address on an address bus 314. The address bus 314 is generally coupled to a memory controller (not shown in FIG. 7). Typically, a row address is initially received by the address register 312 and applied to a row address multiplexer 318. The row address multiplexer 318 couples the row address to a number of components associated with either of two memory arrays 320, 322 depending upon the state of a bank address bit forming part of the row address. Associated with each of the memory arrays 320, 322 is a respective row address latch 326, which stores the row address, and a row decoder 328, which decodes the row address and applies corresponding signals to one of the arrays 320 or 322.

The row address multiplexer 318 also couples row addresses to the row address latches 326 for the purpose of refreshing the memory cells in the arrays 320, 322. The row addresses are generated for refresh purposes by a refresh counter 330, which is controlled by a refresh controller 332. The refresh controller 332 is, in turn, controlled by the command decoder 334.

After the row address has been applied to the address register 312 and stored in one of the row address latches 326, a column address is applied to the address register 312. The address register 312 couples the column address to a column address latch 340. Depending on the operating mode of the SDRAM 300, the column address is either coupled through a burst counter 342 to a column address buffer 344, or to the burst counter 342 which applies a sequence of column addresses to the column address buffer 344 starting at the column address output by the address register 312. In either case, the column address buffer 344 applies a column address to a column decoder 348, which applies various column signals to corresponding sense amplifiers and associated column circuitry 350, 352 for one of the respective arrays 320, 322.

Data to be read from one of the arrays 320, 322 is coupled to the column circuitry 350, 352 for one of the arrays 320, 322, respectively. The read data is then coupled to a data output buffer 356, which applies the read data to a data bus 358. In accordance with the present invention, the data output buffer 356 provides read data signals having slew rates that are substantially insensitive the power supply voltage changes. Data to be written to one of the arrays 320, 322 are coupled from the data bus 358 through a data input register 360 to the column circuitry 350, 352 where the write data are transferred to one of the arrays 320, 322, respectively. A mask register 364 may be used to selectively alter the flow of data into and out of the column circuitry 350, 352, such as by selectively masking data to be read from the arrays 320, 322.

Figure 8:
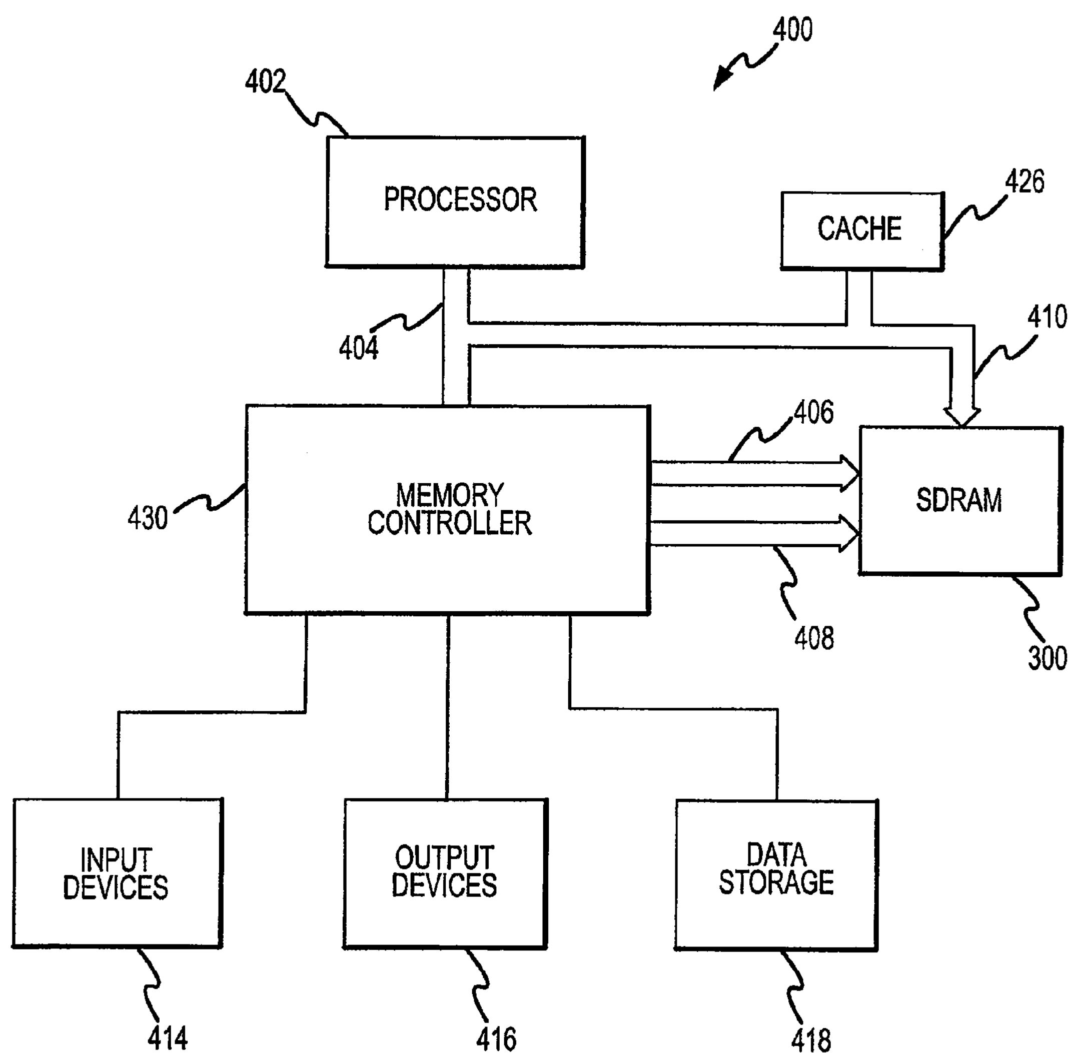
FIG. 8 is a block diagram of an embodiment of a computer system using the memory device of FIG. 7 or some other memory device having an output buffer in accordance with the present invention.

FIG. 8 shows an embodiment of a computer system 400 that may use the SDRAM 300 or some other memory device that contains one or more examples of the signal accelerate system of the present invention. The computer system 400 includes a processor 402 for performing various computing functions, such as executing specific software to perform specific calculations or tasks. The processor 402 includes a processor bus 404 that normally includes an address bus 406, a control bus 408, and a data bus 410. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to store data or retrieve data from external storage media (not shown). Examples of typical storage devices 418 include hard and floppy disks, tape cassettes, and compact disk read-only memories (CD-ROMs). The processor 402 is also typically coupled to a cache memory 426, which is usually static random access memory ("SRAM") and to the SDRAM 300 through a memory controller 430. The memory controller 430 includes an address bus coupled to the address bus 314 (FIG. 7) to couple row addresses and column addresses to the SDRAM 300, as previously explained. The memory controller 430 also includes a control bus that couples command signals to a control bus 306 of the SDRAM 300. The external data bus 458 of the SDRAM 300 is coupled to the data bus 410 of the processor 402, either directly or through the memory controller 430.

Although the present invention has been described with reference to the disclosed embodiments, persons skilled in the art will recognize that changes may be made in form and detail without departing from the spirit and scope of the invention. For example, the switching times of the signal at the DQ_OUT terminal can be adjusted by other means, such as by adjusting the delays of the NOR gate 22 and the NAND gate 26 or the delays of the inverters 24, 28 as a function of supply voltage. The relative timing of the D_PUP and D_PDN signals applied to the output buffer 50 could also be adjusted commensurate with the magnitude of the supply voltage. These and other modifications are well within the skill of those ordinarily skilled in the art. Accordingly, the invention is not limited except as by the appended claims.

We claim:

1. An output buffer, comprising:

a final driver powered by a power supply voltage, the final driver being operable to generate a first value of a data output signal responsive to receiving a first digital signal and to generate a second value of the data output signal responsive to receiving a second digital signal, the rate at which the final driver transitions the data output signal to at least one of the first and second values responsive to the digital signals varying with the magnitude of the power supply voltage, the final driver being operable to generate the first value of the data output signal responsive to receiving a first value of the first digital signal and a first value of the second digital signal, and to generate the second value of the data output signal responsive to receiving a second value of the first digital signal and a second value of the second digital signal, the final driver comprising:

a first voltage-controlled switch having a first terminal coupled to the power supply voltage, a second terminal coupled to an output terminal, and a control terminal coupled to receive the first digital signal, the first voltage-controlled switch being closed responsive to the first value of the first digital signal and being opened responsive to the second value of the first digital signal;

a second voltage-controlled switch having a first terminal coupled to another power supply voltage, a second terminal coupled to the output terminal, and a control terminal coupled to receive the second digital signal, the second voltage-controlled switch being closed responsive to the second value of the second digital signal and being opened responsive to the first value of the second digital signal; and a pre-driver receiving the power supply voltage and generating the first and second digital signals responsive to a data input signal, the pre-driver being operable to delay the first digital signal relative to the second digital signal, the magnitude of the delay being a function of the magnitude of the supply voltage and being adjusted to allow the pre-driver to compensate for the variations in the rate at which the final driver transitions the data output signal responsive to variations in the magnitude of the power supply voltage.

2. The output buffer of claim 1 wherein the first voltage-controlled switch comprises a first MOSFET transistor having one of its source and drain coupled to the power supply voltage, the other one of its source and drain coupled to the output terminal, and its gate coupled to receive the first digital signal, and wherein the second voltage-controlled switch comprises a second MOSFET transistor having one of its source and drain coupled to the another power supply voltage, the other one of its source and drain coupled to the output terminal, and its gate coupled to receive the second digital signal.

3. The output buffer of claim 2 wherein the first MOSFET transistor comprise a PMOS transistor, and the second MOSFET transistor comprises an NMOS transistor.

4. The output buffer of claim 1, further comprising a bias device operable to bias the output terminal to a bias voltage when the first switch is open responsive to receiving the second value of the first digital signal and the second switch is open responsive to receiving the first value of the second digital signal.

5. An output buffer comprising a driver circuit coupled to receive a power supply voltage, the driver circuit operable to generate an output signal having either a first value responsive to receiving a power up signal a second output value responsive to receiving a power down signal, the output signal having a first slew rate transitioning between the first output value and the second output value responsive to the power up signal being transitioned from a respective second value to a respective first value a first delay after the power down signal is transitioned from a respective second value to a respective first value, the final driver further operable to transition the output signal from the second output value to the first output value responsive to the power down signal being transitioned from the respective first value to the respective second value a second delay after the power up signal is transitioned from the respective first value to the respective second value.

6. An output buffer, comprising:

an output circuit receiving a power supply voltage and operable to produce an output signal; and a control circuit coupled to the output circuit and the power supply voltage, the control circuit operable to regulate the rate at which the output circuit transitions the output signal as a function of the value of the power supply voltage such that the transition rate of the output signal from a first level to a second level is substantially equal to the transition rate of the output signal from the second level to the first level, the control circuit comprising a delay adjustment circuit coupled to the power supply voltage, the delay adjustment circuit operable to provide first and second delay signals to the output circuit for regulating the transition rate of the output signal responsive to the value of the power supply voltage, the first delay signal and the second delay signal each transitioning between respective first and second values, the transitioning between the first and second values for the first and second delay signals being delayed by the delay adjustment circuit responsive to a change in the power supply voltage.

7. A memory device, comprising:

a command decoder;

an address decoder;

an array of memory cells arranged in rows and columns; and a data path extending between a plurality of externally accessible data bus terminals and the array of memory cells for coupling data signals to and from the memory arrays through externally accessible terminals, the data path comprising:

a data input buffer having input terminals coupled to the data bus terminals and output terminals coupled to the array of memory cells; and a data output buffer having input terminals coupled to the array of memory cells and output terminals coupled to the data bus terminals, the data output buffer comprising:

a driver circuit coupled to receive a power supply voltage, the driver circuit operable to generate an output signal having either a first value responsive to receiving a power up signal a second output value responsive to receiving a power down signal, the output signal having a first slew rate transitioning between the first output value and the second output value responsive to the power up signal being transitioned from a respective second value to a respective first value a first delay after the power down signal is transitioned from a respective second value to a respective first value, the final driver further operable to transition the output signal from the second output value to the first output value responsive to the power down signal being transitioned from the respective first value to the respective second value a second delay after the power up signal is transitioned from the respective first value to the respective second value.

8. A memory device, comprising:

a command decoder;

an address decoder;

an array of memory cells arranged in rows and columns; and a data path extending between a plurality of externally accessible data bus terminals and the array of memory cells for coupling data signals to and from the memory arrays through externally accessible terminals, the data path comprising:

a data input buffer having input terminals coupled to the data bus terminals and output terminals coupled to the array of memory cells; and a data output buffer having input terminals coupled to the array of memory cells and output terminals coupled to the data bus terminals, the data output buffer comprising:

an output circuit receiving a power supply voltage and operable to produce an output signal; and a control circuit coupled to the output circuit and the power supply voltage, the control circuit operable to regulate the rate at which the output circuit transitions the output signal as a function of the value of the power supply voltage such that the transition rate of the output signal from a first level to a second level is substantially equal to the transition rate of the output signal from the second level to the first level, the control circuit comprising a delay adjustment circuit coupled to the power supply voltage, the delay adjustment circuit operable to provide first and second delay signals to the output circuit for regulating the transition rate of the output signal responsive to the value of the power supply voltage, the first delay signal and the second delay signal each transitioning between respective first and second values, the transitioning between the first and second values for the first and second delay signals being delayed by the delay adjustment circuit responsive to a change in the power supply voltage.

9. A computer system, comprising:

an integrated circuit processor having a plurality of externally accessible terminals coupled to a processor bus;

an input device coupled to the processor through the processor bus adapted to allow data to be entered into the computer system;

an output device coupled to the processor through the processor bus adapted to allow data to be output from the computer system; and a dynamic random access memory coupled to a processor bus, the dynamic random access memory comprising:

a command decoder receiving memory command signals through externally accessible terminals, the command decoder generating memory control signals responsive to predetermined combinations of the command signals;

an address decoder receiving address signals through externally accessible terminals, the address decoder generating row and column addressing signals responsive to the address signals;

an array of dynamic random access memory cells arranged in rows and columns from which data are read and to which data are written at locations corresponding the address signals responsive to the memory control signals; and a data path extending between a plurality of externally accessible data bus terminals and the array of memory cells for coupling data signals to and from the memory arrays through externally accessible terminals, the data path including a data input buffer having input terminals coupled to the data bus terminals and output terminals coupled to the array of memory cells, and a data output buffer having input terminals coupled to the array of memory cells and output terminals coupled to the data bus terminals, the data output buffer comprising:

a final driver powered by a power supply voltage, the final driver being operable to generate a first value of a data output signal responsive to receiving a first digital signal and to generate a second value of the data output signal responsive to receiving a second digital signal, the rate at which the final driver transitions the data output signal to at least one of the first and second values responsive to the digital signals varying with the magnitude of the power supply voltage, the final driver being operable to generate the first value of a data output signal responsive to receiving a first value of the first digital signal and a first value of the second digital signal, and to generate the second value of the data output signal responsive to receiving a second value of the first digital signal and a second value of the second digital signal, the magnitude of a voltage corresponding to the first value of the first digital signal being substantially equal to the magnitude of a voltage corresponding to the first value of the second digital signal, and the magnitude of a voltage corresponding to the second value of the first digital signal being substantially equal to the magnitude of a voltage corresponding to the second value of the second digital signal; and a pre-driver receiving the power supply voltage and generating the first and second digital signals responsive to a data input signal, the pre-driver being operable to delay the first digital signal relative to the second digital signal, the magnitude of the delay being a function of the magnitude of the supply voltage and being adjusted to allow the pre-driver to compensate for the variations in the rate at which the final driver transitions the data output signal responsive to variations in the magnitude of the power supply voltage; the pre-driver is operable to delay a transition of the second digital signal to the second value after a transition of the first digital signal to the second value, the delay of the transition of the second digital signal having a first magnitude that is a function of the magnitude of the supply voltage and is adjusted to allow the pre-driver to compensate for the variations in the rate at which the final driver transitions the data output signal responsive to variations in the magnitude of the power supply voltage.

10. A method of providing an output signal, comprising:

generating the output signal that transitions between a first power supply voltage and a second power supply voltage at a first transition rate;

detecting any change in the magnitude of the first power supply voltage from the first value to a second value;

detecting any change in the magnitude of the second power supply voltage from a third value to a fourth value;

after detecting any change in the magnitude of the first power supply voltage from the first value to the second value or any change in the magnitude of the second power supply voltage from the third value to the fourth value, generating the output signal that transitions between the first power supply voltage and the second power supply voltage at a second transition rate; and regulating at least one of the first transition rate and the second transition rate so that the second transition rate is substantially equal to the first transition rate.

11. The method of claim 10 wherein the act of detecting any change in the magnitude of the first power supply voltage comprises detecting an increase in the magnitude of the first power supply voltage to a higher voltage.

* * * * *